United States Patent [19]

Bohn

[11] Patent Number: 4,891,841
[45] Date of Patent: Jan. 2, 1990

[54] RECIPROCAL, SUBTRACTIVE, AUDIO SPECTRUM EQUALIZER

[75] Inventor: Dennis A. Bohn, Bothell, Wash.

[73] Assignee: Rane Corporation, Everett, Wash.

[21] Appl. No.: 158,697

[22] Filed: Feb. 22, 1988

[51] Int. Cl.$^4$ .............................................. H03G 5/00
[52] U.S. Cl. ..................................... 351/98; 333/28 T
[58] Field of Search ............. 328/28 T, 28 R; 381/98, 381/103

[56] References Cited

U.S. PATENT DOCUMENTS

| | | | |
|---|---|---|---|
| 3,755,749 | 8/1973 | Van Ryswyk | 328/167 |
| 3,921,109 | 11/1975 | Gundry | 333/28 R |
| 4,004,253 | 1/1977 | Takasaki et al. | 333/28 R |
| 4,176,329 | 11/1979 | Moskowitz | 333/28 T |
| 4,219,788 | 8/1980 | Cordell | 333/28 R |
| 4,336,501 | 6/1982 | Ishikawa et al. | 333/28 R |
| 4,438,409 | 3/1984 | Katsumata | 333/28 T |

OTHER PUBLICATIONS

Lancaster, Active Filter Cookbook, 1979, p. 151.
Lancaster, Active Filter Cookbook, FIGS. 7-7 and 7-15(B), 1979.
J. Audio Eng. Soc., vol. 34, No. 9, Sep. 1986, "Constant-Q Equalizers", Dennis A. Bohn.

Primary Examiner—Forester W. Isen
Attorney, Agent, or Firm—Larry A. Jackson

[57] ABSTRACT

An equalizer circuit is disclosed having adjustable bandpass filters connected with operational amplifiers in feedforward and feedback paths so as to form frequency selective boost and cut signal components, which are then combined to form the equalized output signal by a subtractive operation with a direct unfiltered signal path arranged in parallel with the filtered feedforward and feedback paths. The circuit exhibits a constant-Q operation in that it can be adjusted for selected frequency boost and cut without distortion of the component bandwidths of the individual filters.

4 Claims, 5 Drawing Sheets

RECIPROCAL, SUBTRACTIVE, AUDIO SPECTRUM EQUALIZER

BACKGROUND OF THE INVENTION

This invention pertains to signal spectrum equalizers of the type that provide adjustment in incremental bandwidths with a minimum of interaction between each spectrum segment. While this invention has general applicaion, the principles it embodies are especially suited for graphic and parametric equalizers used in performing real, or near real-time audio spectral manipulation with minimum operator effort. Such efficient spectrum manipulation is essential in the recording and broadcast industries and in environmental conditions for the performing arts.

Equalizers in current use fall into two broad categories: parametric (also known as "variable parameter") and graphic.

Parametric. The parametric or varible parameter equalizer consists of a number of bandpass filter sections operating independently with respect to each other within the passband of the equalizer. Each filter section permits independent adjustment of center frequency, bandwidth and level.

Graphic. The ideal graphic equalizer permits a one-to-one correspondence between the position of each filter segment control (the "slider") and a graph of the desired equalizer level adjustment vs. frequency. Each filter segment has a fixed center frequency. This permits rapid and unambiguous filter adjustments with a minimum of ancillary test equipment.

Although not as well known, there also exists a hybrid of the above two major classes. This hybrid is a specially designed graphic equalizer that permits some adjustment of the frequency centers by an interpolation effect, hence called the "interpolating" graphic equalizer.

The design and use of these equilizers depends in part on the standard center frequencies that have been prescribed by the International Standards Organization (ISO) for the audio equalizers and other equipment where fixed frequency characterization is required. While the ISO standards are generally useful for many applications, other uses require complete discretion in center frequency selection. An example of this need is in the characterization and modification of the reverberation spectrum of a performance hall where frequencies falling in between ISO allocations may occur. The parametric equalizer provides this flexibility, but economic considerations severely limit the number of parametric filters required to cover the complete spectrum. The interpolation filter provides a compromise between parametric control and the number of required filter sections, as well as the convenience of a graphics format.

Figure 5:
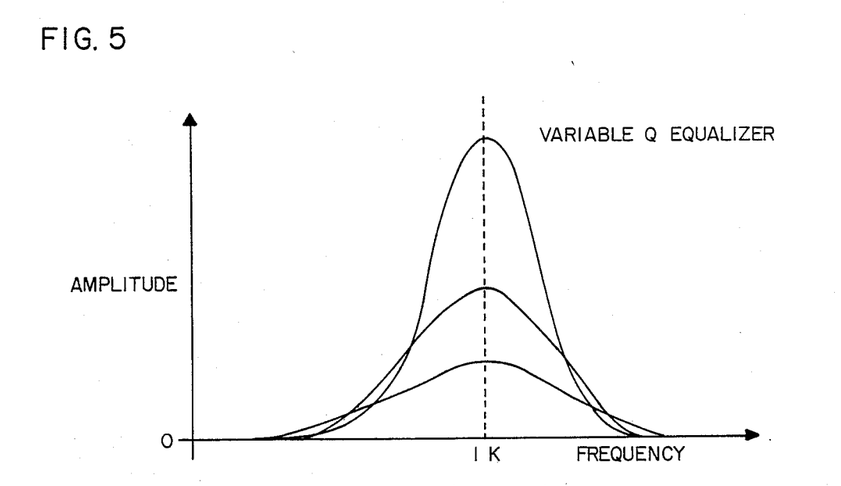
FIG. 5 is an illustration of the problem of filter bandwidth variation for different levels of boost and cut.

These families of equalizers have a common design problem. That is the achievement of constant bandwidth with independent changes in "boost" (gain) and "cut" (attenuation) for each bandpass filter. This problem, which is a characteristic of most commonly used equalizer designs, is illustrated in the graph of FIG. 5 that accompanies the detailed description below. For the various boost levels chosen in FIG. 5, it is clear that the bandwidth changes by a large percentage. This interdependency of bandwidth and gain prevents the amplitude selectivity of the filter from being faithfully implemented as one of a number of filter segments in the equalizer, except at the levels near maximum boost or cut. Therefore, the parameters of the parametric equalizer become extremely interdependent. This interdependency in turn lessens the ability of the interpolating equalizer to achieve smooth transition to intermediate signal frequencies between adjacent filters, i.e., low ripple factor. It also degrades the desirable match between the levels of equalizer response, as indicated by each slider position of the graphics equalizer, and a given spectrum response chart.

Figure 4:
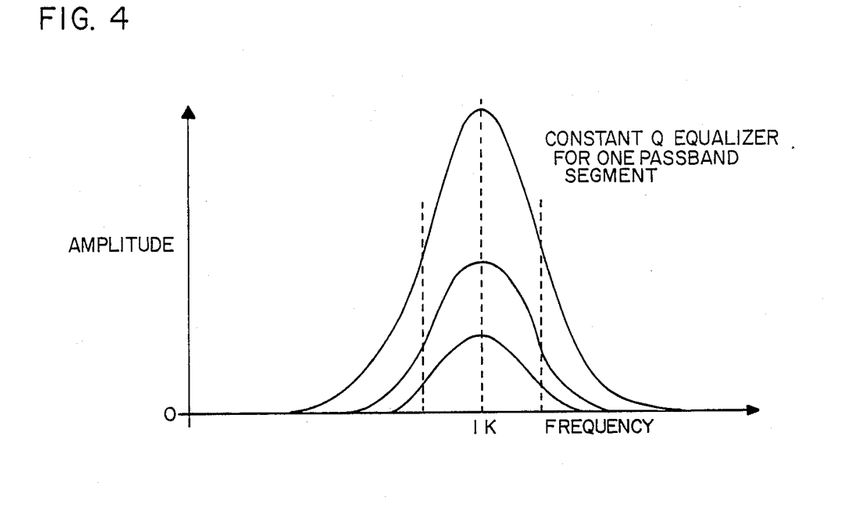
FIG. 4 illustrates filter bandwidth control when the equalizer exhibits constant-Q performance.

If, on the other hand, the bandpass filters were interconnected so as to exhibit a "constant Q", the above interdependency problems of equalizer designs would be greatly alleviated. The term "constant Q" refers to the ability to achieve a constant percentage bandwidth for a given bandpass center frequency. FIG. 4 of the accompanying drawings illustrates the frequency response characteristics of a bandpass filter at several different boost levels for a filter segment employing this "constant Q" feature. It is apparent that the effective bandpass characteristics of the basic filter are maintained over the indicated levels of gain.

Figure 6:
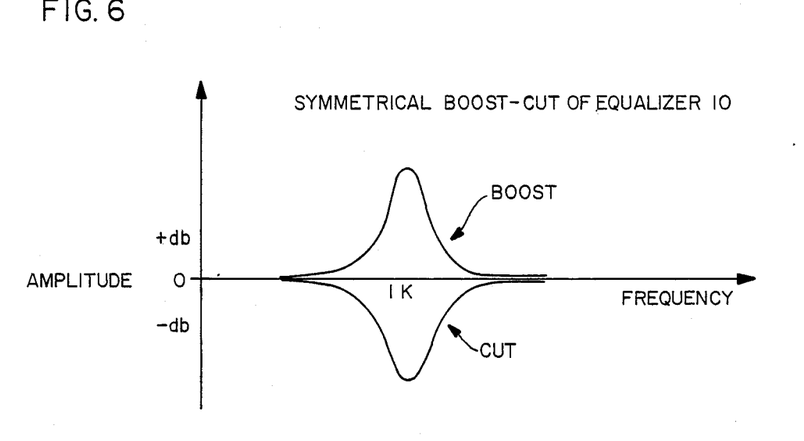
FIG. 6 illustrates the symmetrical boost and cut frequency response of the equalizer filter sections of the FIG. 1 embodiment.
Figure 7:
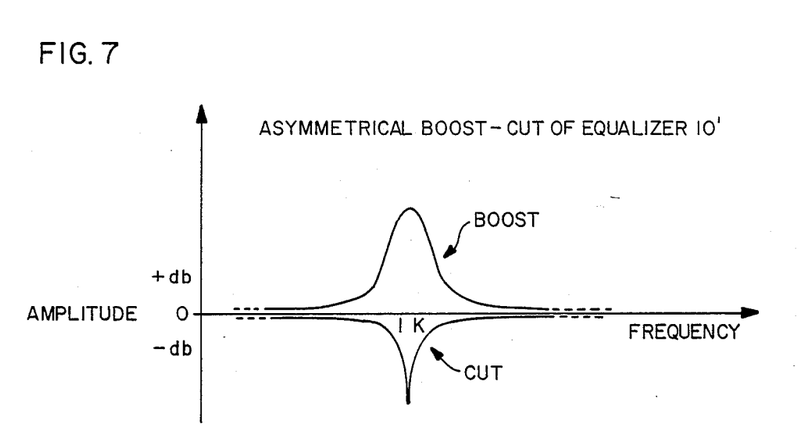
FIG. 7 illustrates the asymmetrical cut mode relative to boost exhibited by the equalizer of FIG. 2.

Another feature often required in the designs of these equalizers is that of spectral symmetry of the boost compared to cut modes. Symmetry facilitates the synthesis of an inverse transfer function, thus providing a complementary phase and amplitude characteristic useful for altering or "flattening" a given frequency response profile. In FIG. 6 of the drawings that accompany the detailed description, an equalizer response is shown having this boost-cut symmetry. However, in some applications it may be required or desirable to retain an asymmetrical spectral shape. An example of the latter is where the cut mode has certain rejection characteristics that can be positioned at selected frequency points to compensate for undesirable environmental acoustics. The diagram in FIG. 7 illustrates this asymmetrical feature. An asymmetrical boost-cut response is known from the filter design work of Van Ryswyk et al disclosed in U.S. Pat. No. 3,755,749; but that configuration has the drawback of providing only one frequency band per section.

Another desirable aspect of equalizers is that of providing "fail-soft" characteristics in the overall design. Some configurations use tandem filter sections which have serious single point failure charcteristics, i.e., any single filter failure would disable the operation of the entire array of filters. For parallel filter architectures, a filter failure would result in undesirable "holes" in the spectrum envelope. This problem was first addressed by Gundry in U.S. Pat. No. 3,921,104, who provides a design in which failure of a filter section results in the filtered output spectrum segment reverting to the benign values of the input spectrum, thus "failing-soft".

These and other design considerations and certain proposed solutions are set forth in my article "Constant-Q Graphic Equalizers", J.. Audio Engineering Society, Vol. 34, No. 9, 1986 September, pages 611–626.

SUMMARY

The embodiments of the invention described more fully below concern improvements to currently available, adjustable audio spectrum equalization equipment such as disclosed in U.S. Pat. Nos. 3,921,104, 3,755,749 and in my above cited article "Constant Q Graphic Equalizers".

To incorporate the constant-Q features described above, this invention utilizes a circuit topology based upon the principles of a unique reciprocal, subtractive signal processing approach. In the preferred embodiment, symmetrical boost and cut performance about a true 0-dB reference line in any selected spectrum segment is achieved while maintaining constant selectivity at all slider positions. This feature is obtained by the synthesis of the boost and cut functions from a plurality of parallel signal paths that are combined in an output summing junction. These paths comprise: direct, polarized, but unfiltered signal paths from the input signal terminal to the output summing network; an indirect feedforward path to the aforementioned output summing junction through a bank of contiguous, parallel connected bandpass filters spanning the desired audio spectrum; and an indirect feedback path through the same bandpass filter bank to the aforementioned output summing junction. Boost or cut operation is controlled by the action of a variable tap (slider) of the potentiometer. This potentiometer, in its detent or neutral position allows components of the signal to simultaneously pass through the feedback, feedforward and direct channels, to synthesize a unity or spectrally flat transfer function. In the boost mode the slider controlled signal component is fed forward through the associated filter section so as to add to a direct path polarized signal component. The direct path signal components are appropriately phased to cancel by subtraction all but one unity gain signal which is positively combined with the filtered components to cause the desired boost of the selected frequencies.

The cut mode is synthesized by combining the signal passing through the feedback channel, when enabled by the appropriate slider control, with the direct signal channels which subtract to produce a transfer function having an inverse, symmetrical relationship to the previously mentioned boost synthesis.

In an alternative configuration, a symmetrical filter operation is achieved by using the above basic network design modified with minor changes in the feedback loop. Asymmetry in the cut relative to boost may serve in some applications to selectively mask undesirable acoustics of a particular environment.

A fail-soft feature is provided by the network architecture due to the existence of the multiple direct signal paths between the input terminal and the output summing matrix which by-pass the active bandpass filter sections. Thus, failure of the bandpass filter permits more than one alternate signal path from the input terminal to the output summing matrix.

DETAILED DESCRIPTION OF PREFERRED AND ALTERNATIVE EMBODIMENTS

Figure 1:
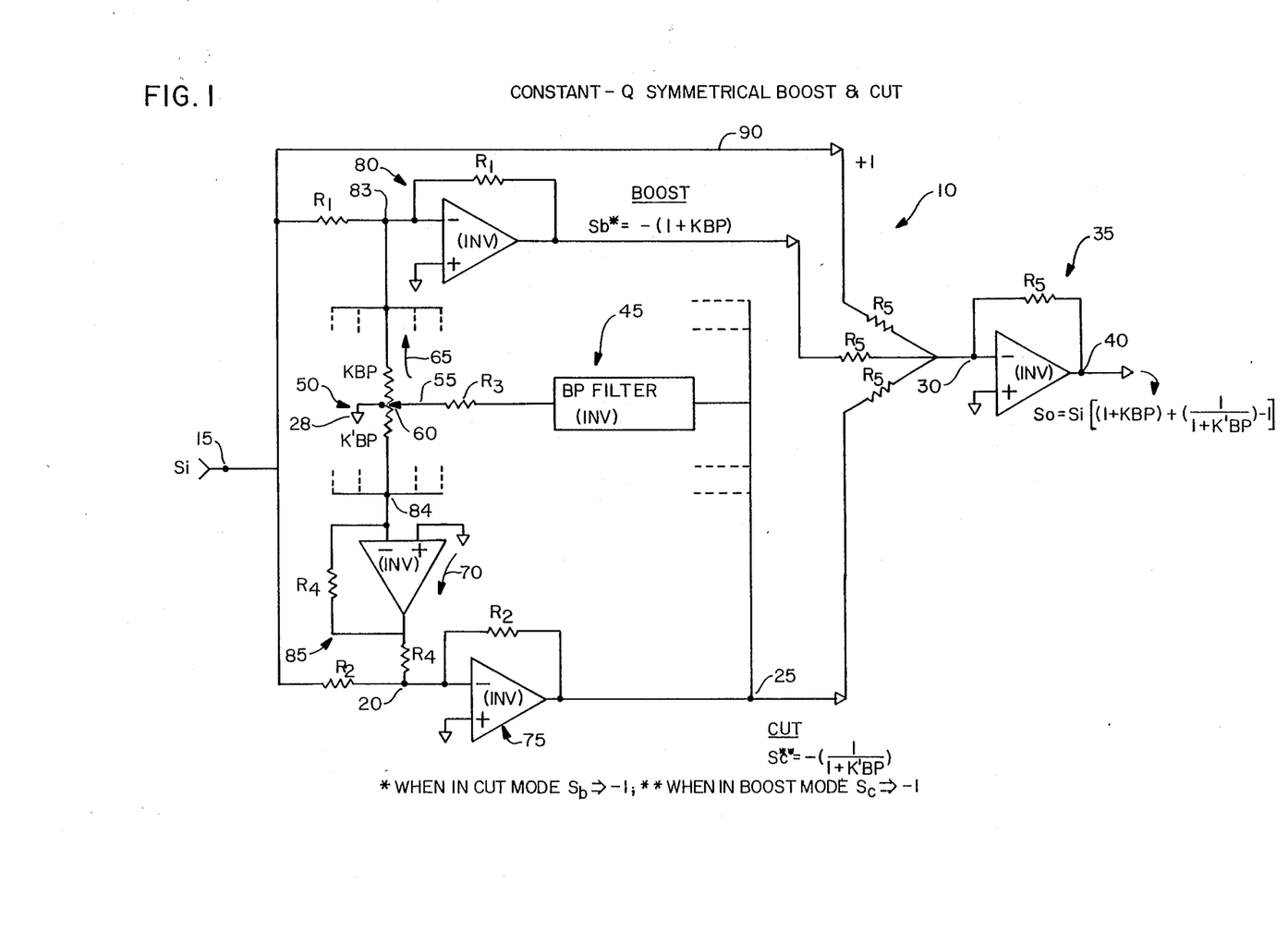
FIG. 1 is a block diagram of an adjustable audio spectrum equalizer providing constant-Q and symmetrical boost and but spectral response characteristics for each of a plurality of bandpass segments.

With reference to FIG. 1, an equalizer 10 is disclosed for adjusting the audio spectral response of a signal applied to input terminal 15. Equalization is performed by the synthesis of a network of parallel signal paths connecting terminal 15 to output terminal 40. Signal components carried by these paths are combined at summation point 30 and then inverted by a unity gain inverting amplifier 35 to restore the positive polarity of the output signal $S_o$ at terminal 40.

The degree of boost or cut for signal components passing through a bandpass filter bank 45 is controlled by an equal number of potentiometers 50 having sliders (taps) set by the user. When the potentiometer sliders 55 are positioned above a neutral position 60, the boost mode is enabled. When the sliders 55 are positioned below neutral position 60, the cut mode is established. When in the neutral position 60, signal components in the feedforward and feedback paths 65 and 70 are benigh (at 0 level) as a result of connecting the mid-points of the potentiometers 50 through a fixed tap to ground 28. A detent may be provided on the sliders 55 at this grounded neutral position.

More particularly, boosting is accomplished as follows: the input signal Si entering the input terminal 15 and summation point 20 via summing resistor R2 is inverted by summing amplifier 75 and branches at 25 to the contiguous bank of inverting bandpass filters 45. Each filter output is connected through a gain setting resistor R3 to the potentiometer slider 55. The boost signal component continues through the potentiometer 50 scaled by a controlled gain factor KBP and is applied to summing amplifier 80 at junction 83. At summation amplifier 80 it is positively combined with the in phase direct signal arriving through summing resistor R1 from the input terminal 15. Thus the boost signal components may be characterized by the following notation:

$$S_b = -(1 + KBP)$$

where $S_b$ = Boost signal

K = Bandpass filter scaling factor, controlled by selection of resistor R3 and setting of potentiometer slider 55

BP = Bandpass filter 45 is inverting (INV) and has a normalized full value of (−1)

When the boost component is inverted at the output stage, $S_b$ contributes a positive value of 1+KBP.

Cutting is accomplished as follows: A feedback signal is routed from BP filter 45 to the potentiometer slider 55 as noted for the feedforward signal. Scaled portions of the bandpass signals are passed through K'BP and combined at a summing junction 84. At this point the composite feedback signal is again inverted by inverting amplifier 85 in feedback path 70 and then returned to summing junction 20 where it is combined out of phase with the input signal. The inversion term thus created by the negative feedback produces the desired inverse cut signal $S_c$ at terminal 25 which is then combined at junction 30 with the other signal paths.

The corresponding notation may be shown as follows:

$$S_c = -\frac{(1)}{(1 + K'BP)}$$

where
$S_c$ = Cut signal, and
$K'$ = The bandpass filter scaling factor set by R3 and the position of slider 55.

In a similar manner, the normalized and inverted cut signal at terminal 40 contributes the value $$\frac{1}{1 + K'BP}.$$

A further non-inverted direct parallel signal path 90 connects the input terminal 15 to output summing junction 30 and contributes a positive +1 signal gain to the other parallel signal components. Because of the relative polarity of path 90 signals, the other parallel path components, including boost or cut components are subtracted from the positive path 90 signal. This subtractive process synthesizes the output signal $S_o$ which is then inverted by output amplifier 35 to restore the polarity to that of the input signal.

The complete expression for the output signal $S_o$ as a function of the input signal $S_i$ may be written as $$S_i \left[ (1 + KBP) + \frac{(1)}{(1 + K'BP)} - 1 \right].$$

When the potentiometer slider is set in a boost position $K'BP-0$, and the relationship reduces to $S_o = S_i (1+KBP)$. When the slider is in the cut position, $KBP-0$, and $$S_o = S_i \frac{(1)}{(1 + K'BP)}.$$

It is observed that the boost and cut modes have symmetry about the unity (0 dB) signal level as shown in FIG. 6. The passband filters 45 being nested inside the various amplifier stages causes the bandwidths to remain constant, independent of the degree of boost or cut, i.e., constant-Q. FIG. 4 illustrates this output condition for one bandpass filter section adjusted to several different levels of boost.

Equalizer 10 also has a bandwidth advantage over other circuits that use nested BP filters between serial amplifiers such as U.S. Pat. No. 3,921,104. The advantage is attributed to cancellation of unwanted roll-off effects caused by the relatively low impedance of the numerous parallel ½ slider resistors (from ground 28 to the amplifier inputs) tied to the summing nodes of inverting amplifiers 80 and 85. Unlike prior circuits that have the summing amplifiers arranged in series and that multiply the above noted roll-off effects, the parallel cut and boost signal paths of equalizer 10 when combined with the unfiltered signal at output summing junction 30 substantially cancel the roll off effects. This results in a wider bandwidth when using comparable amplifiers.

Figure 2:
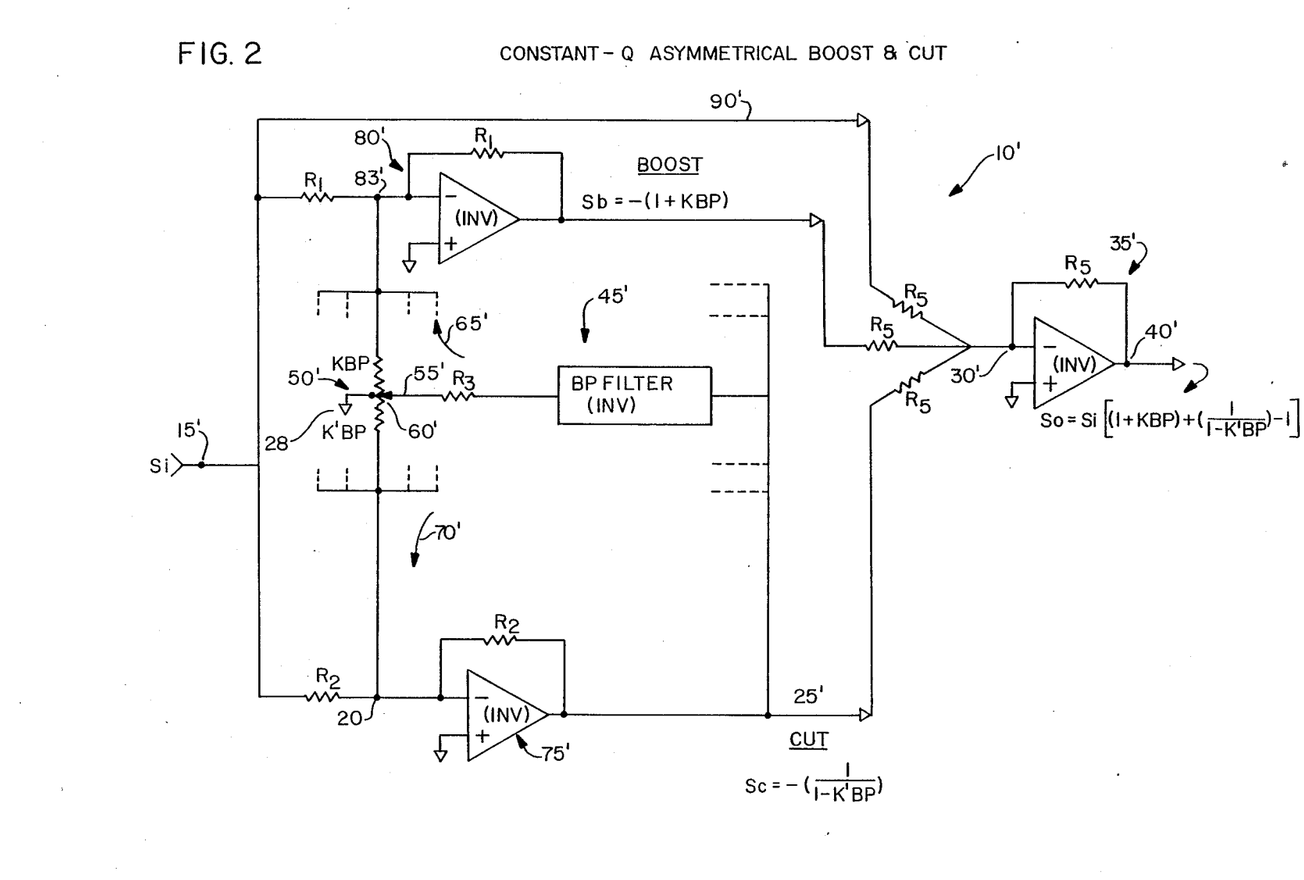
FIG. 2 is a block diagram of an alternate form of the invention that provides constant-Q and asymmetrical boost and cut spectral response characteristics for the bandpass segments.

FIG. 2 shows an equalizer 10' having an alternative configuration compared to FIG. 1. This configuration provides a relatively sharper attenuation, like a "notch" at the frequency corresponding to the point of maximum cut. The boost mode is identical to the configuration of equalizer 10 of FIG. 1. Since the cut response is different (sharper) compared to the boost, the FIG. 2 configuration has been called an asymmetrical boost and cut equalizer. The other aspects of equalizer 10' of FIG. 2, including the characteristic constant-Q, are the same as in the above described symmetrical equalizer.

The cut mode of equalizer 10' is described as follows: The feedback signal is routed from input terminal 15' to the potentiometer slider 55'. As in FIG. 1, the feedback signal is returned to summing and inverting amplifier 75'. However, the inverting amplifier 85 is deleted and the feedback signal is combined in phase with the input signal at junction 20'. The cut feedback component thus created is combined with the other signals in the same manner described for the feedback signal of FIG. 1. Symbolically this may be shown as follows:

$$S_c = -\frac{(1)}{(1 + K'BP)}$$

The normalized output signal at terminal 40' thus contributes the value:

$$S_c = \frac{1}{1 - K'BP}$$

By subtractive combining at junction 30' and polarity inversion by amplifier 35', the output signal may be expressed:

$$S_o = S_i \left[ (1 + KBP) + \frac{1}{(1 - K'BP)} - 1 \right]$$

FIG. 7 illustrates an example of the asymmetrical cut versus boost feature of the bandpass characteristics of equalizer 10'. By comparison with FIG. 6, the asymmetrical boost is shown to have sharper cut characteristics due to the $$\frac{1}{1 - K'BP}$$

factor which may be used to advantage in certain applications to "notch" out unwanted acoustic effects. It is noted that the K'BP factor is constrained to values greater than K'BP=2 to prevent oscillations and to avoid the trivial solution of unity.

In connection with FIG. 1 it is observed that the functions of the summation junctions 20, 30, 83 and 84 of equalizer 10 are combined with the inverting function implemented in the form of operational amplifiers 75, 35, 80 and 85, respectively. It is understood that various combinations of inverting amplifiers can be utilized to meet the detailed requirements of a particular implementation.

Figure 3:
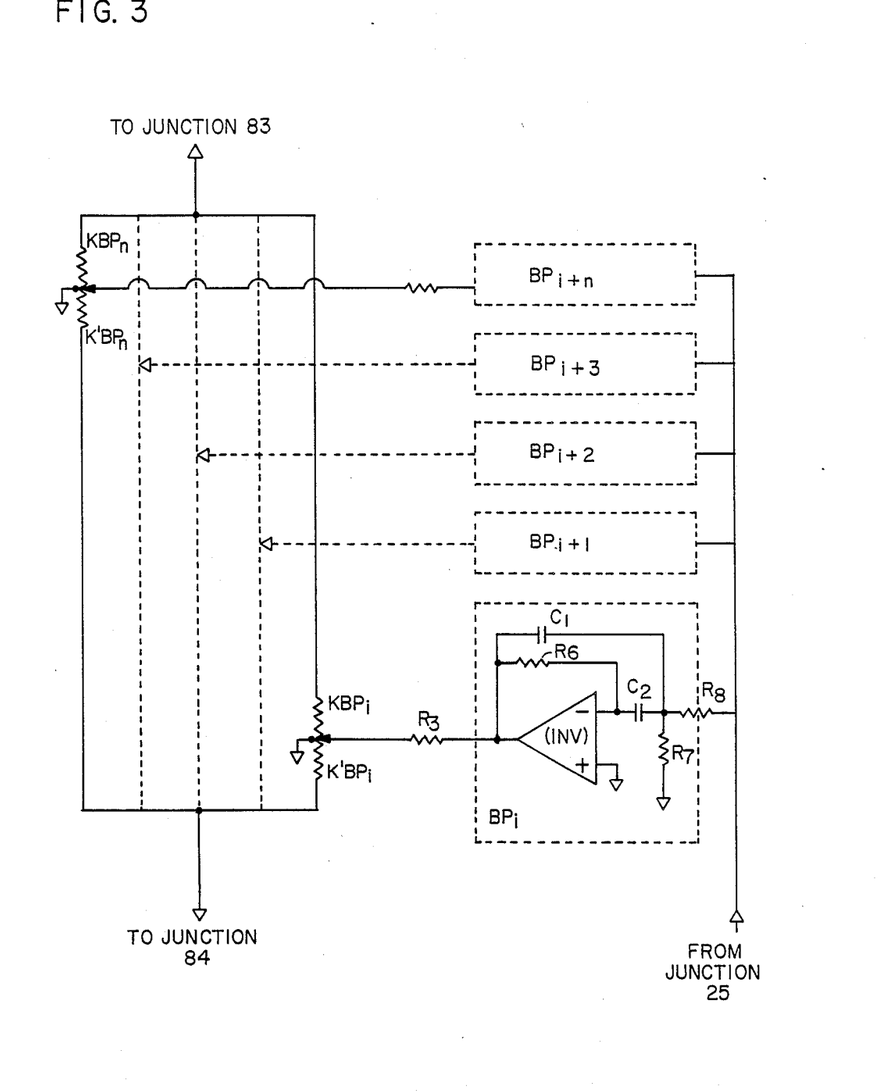
FIG. 3 is a diagram of a practical circuit that implements the bandpass filter segments in the equalizers of FIGS. 1 and 2.

FIG. 3 illustrates in greater detail the configuration of the bank of band pass filters and associated potentiometers shown more generally in FIG. 1.

FIG. 3 also illustrates a typical inverting active bandpass filter which forms each of the bank of filter sections or segments. Any inverting bandpass filter topology will work, including any of the various state-variable or biquad multiple operational amplifier bandpass configurations. Parametric equalizers based on FIG. 1 require the latter, with additional controls added for the variable center frequency and bandwidth functions.

The principles employed in the above embodiments of the invention are the feedforward path of the equalizer network to provide the constant-Q boost function in combination with the direct signal paths; the feedback loop to contribute the constant-Q cut function, also in combination with the direct signal paths; and the combining of the boost, cut and direct path signals by means of a subtractive operation.

For most applications using fixed frequency and bandwidth bandpass filters 45, the center frequencies are spaced at one-third octave intervals over a range of ten octaves. To minimize induced ripple in the output spectrum caused by phaser addition of adjacent filters it has been determined that the bandpass filters should be second-order Butterworth. This provides the best compromise between selectivity and crossover interaction with adjacent filters. With proper combining topology, boost or cut values of 20 dB are attainable.

While only particular embodiments have been disclosed herein, it will be readily apparent to persons skilled in the art that numerous changes and modifications can be made thereto, including the use of equivalent means, devices and method steps without departing from the spirit of the invention.

I claim:

1. A constant-Q multiple bandpass frequency equalizer circuit comprising:
   first signal channel means, boost signal channel means, and cut signal channel means arranged in parallel between an input and output;
   said first signal channel means providing a passthrough signal having a relative gain of unity for all frequency components of an input signal and having a predetermined first polarity;
   said boost signal channel means having gain adjustable bandpass filter means connected so as to produce a composite boost signal of a second polarity opposite that of said passthrough signal and being characterized by the relative value of $1+KBP$, wherein K is an adjustable scale factor and BP is a bandpass filter response;
   said cut channel means having gain adjustable bandpass filter means connected to produce a composite cut signal also of said second polarity and being characterized by a relative value of $$\frac{1}{(1 \pm K'BP)},$$

wherein K' is another adjustable scale factor and BP is a bandpass filter response;
   signal combining circuit means for combining said composite boost and cut signals with said passthrough signal so that the resulting signal appearing at said output has a relative gain of greater than unity for frequency components that are boosted by said boost signal channel and ha a gain of less than unity for frequency components that are cut by said cut channel means; and wherein
   said cut and boost channel means comprise a first amplifier means connected between said input and said signal combining circuit means, and a second amplifier means connected between said input and said signal combining circuit means, said adjustable bandpass filter means for said cut channel means connected in feedback around said first amplifier means to form said cut channel means and said adjustable bandpass filter means for said boost channel means connected in a feedforward path between an output of said first amplifier means and an input of said second amplifier means to form said boost channel means.

2. The constant-Q multiple bandpass frequency equalizer circuit of claim 1, wherein said first and second amplifier means and said bandpass filter means for said cut and boost channel means each have signal polarity inverting means.

3. A frequency equalizer circuit comprising:
   an input for receiving an input signal having frequency components in one or more predetermined bands;
   output combining circuit means for combining a plurality of intermediate signals derived from said input signal, and having an output;
   direct, boost, and cut signal channels arranged in parallel between said input and output combining circuit means;
   said direct signal channel providing a direct intermediate signal having a relative gain of unity;
   said boost signal channel having a plurality of gain adjustable bandpass filter means connected in a feedforward configuration to produce a boost intermediate signal characterized by a relative gain of unity plus gain adjusted bandpass components contributed by those bandpass filter means connected in said feedforward configuration;
   said cut signal channel having a plurality of gain adjustable bandpass filter means connected in a feedback configuration to produce a cut intermediate signal characterized by the reciprocal of the quantity of unity gain plus or minus gain adjusted bandpass components contributed by those bandpass filter means connected in said feedback configuration; and
   said output combining circuit means connected to said direct, boost, and cut signal channels for subtracting said boost and cut intermediate signals from said direct intermediate signal to produce an equalized output signal that is selectively boosted or cut at adjustable bandpass frequencies, wherein said boost and cut signal channels have circuit means for causing the boost and cut frequency response characteristics to be substantially symmetrical and comprising an additional inverting amplifier means in said feedback configuration of said cut channel.

4. A constant-Q multiple bandpass frequency equalizer circuit comprising:
   first signal channel means, boost signal channel means, and cut signal channel means arranged in parallel between an input and output;
   said first signal channel means providing a passthrough signal having a relative gain of unity for all frequency components of an input signal and having a predetermined first polarity;
   said boost signal channel means having gain adjustable bandpass filter means connected so as to produce a composite boost signal of a second polarity opposite that of said passthrough signal and being characterized by the relative value of $1+KBP$, wherein K is an adjustable scale factor and BP is a bandpass filter response;
   said cut channel means having gain adjustable bandpass filter means connected to produce a composite cut signal also of said second polarity and being characterized by a relative value of $$\frac{1}{(1 \pm K'BP)}$$

wherein K' is another adjustable scale factor and BP is a bandpass filter response; and signal combining circuit means for combining said composite boost and cut signals with said pass-through signal so that the resulting signal appearing at said output has a relative gain of greater than unity for frequency components that are boosted by said boost signal channel and has a gain of less than unity for frequency components that are cut by said cut channel means, and wherein said cut and boost signal channels comprise respectively a first polarity inverting amplifier means connected between said input and said signal combining circuit means, and a second polarity inverting amplifier means connected between said input and said signal combining circuit means, and a polarity inverting adjustable bandpass filter means connected in feedback around said first polarity inverting amplifier means to form said cut signal channel and an adjustable bandpass filter means connected in a feedforward path between an output of said first polarity inverting amplifier means and an input of said second polarity inverting amplifier means to form said boost signal channel; and third polarity inverting amplifier means connected in feedback with said polarity inverting adjustable bandpass filter means around said first polarity inverting amplifier means so as to cause the cut and boost frequency response characteristics to be symmetrical about a flat unity gain response line.

* * * * *